United States Patent
Cohen et al.

(12)
(10) Patent No.: US 6,346,489 B1
(45) Date of Patent: Feb. 12, 2002

(54) PRECLEANING PROCESS FOR METAL PLUG THAT MINIMIZES DAMAGE TO LOW-κ DIELECTRIC

(75) Inventors: Barney M. Cohen, Santa Clara; Suraj Rengarajan, Sunnyvale; Kenny King-Tai Ngan, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/388,991

(22) Filed: Sep. 2, 1999

(51) Int. Cl.[7] ............................................. H01L 21/469
(52) U.S. Cl. ...................... 438/789; 438/597
(58) Field of Search ...................... 438/597, 637–641, 438/672–674, 710, 789

(56) References Cited

U.S. PATENT DOCUMENTS

| 5,043,299 A | 8/1991 | Chang et al. |
| 5,202,008 A | 4/1993 | Talieh et al. |
| 5,352,636 A | 10/1994 | Beinglassx |
| 5,660,682 A * | 8/1997 | Zhao et al. .................. 438/715 |
| 5,788,778 A | 8/1998 | Shang et al. |
| 6,114,259 A * | 9/2000 | Sukharev et al. ........... 438/789 |

* cited by examiner

Primary Examiner—David Nelms
Assistant Examiner—Dung A Le
(74) Attorney, Agent, or Firm—Robert J. Stern

(57) ABSTRACT

The invention is a precleaning process suitable for fabricating metal plugs in a low-κ, carbon-containing dielectric. More specifically, the invention is a process for cleaning a contact area of a metal conductor on a semiconductor workpiece so as to minimize damage to a low-κ, carbon-containing dielectric overlying the metal. After forming contact openings in the low-κ dielectric so as to expose contact areas on the underlying metal conductor, the contact areas are cleaned by exposing the workpiece to an atmosphere formed by plasma decomposition of a mixture of hydrogen-containing and helium gases. Surprisingly, our preclean process can repair damage to the dielectric caused by preceding process steps, such as oxygen plasma ashing processes for removing photoresist.

33 Claims, 2 Drawing Sheets

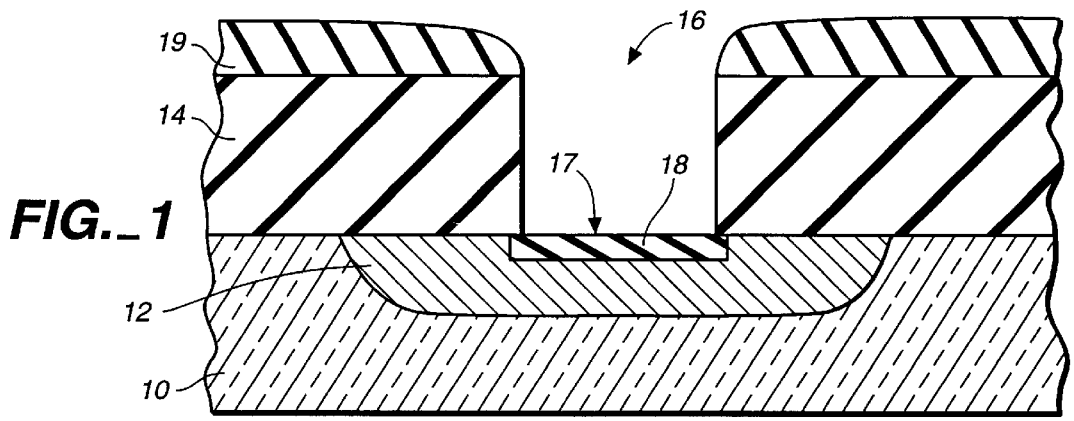
FIG._1
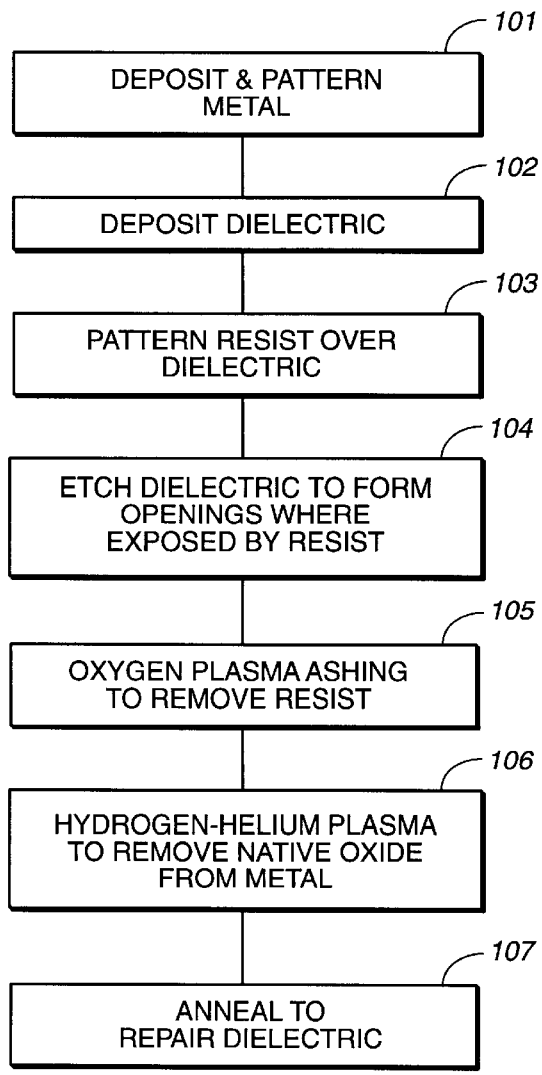
FIG._2

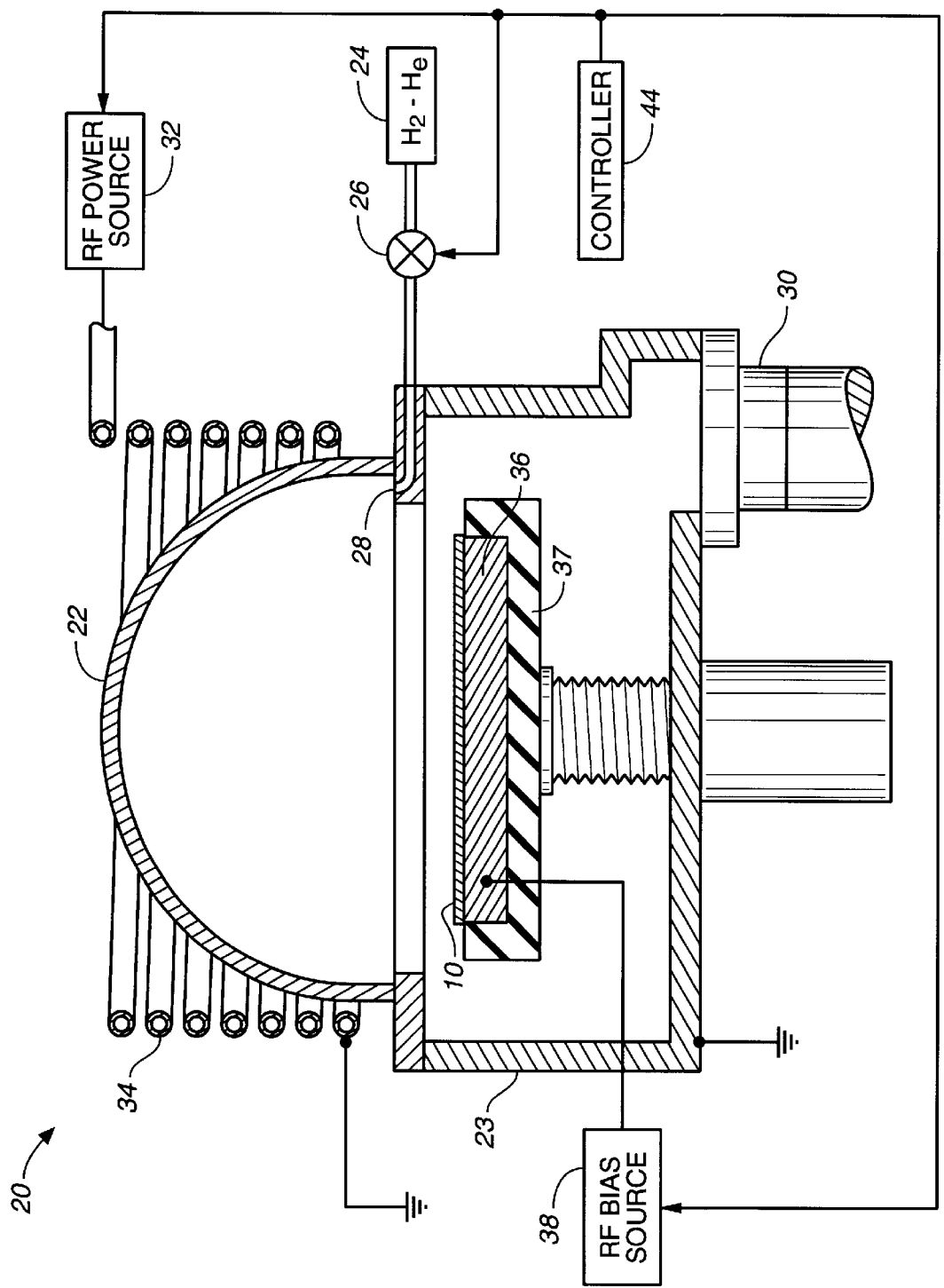
FIG._3

PRECLEANING PROCESS FOR METAL PLUG THAT MINIMIZES DAMAGE TO LOW-κ DIELECTRIC

FIELD OF THE INVENTION

The invention relates generally to processes for manufacturing integrated circuits and other electronic devices. More specifically, the invention relates to precleaning processes for removing native oxide from an area of a metal layer that is exposed by an opening in an overlying dielectric, so that the opening subsequently can be filled by a metal plug.

BACKGROUND OF THE INVENTION

A common process sequence in manufacturing integrated circuits and other electronic devices is to deposit a number of metal conductors on a substrate, then cover the metal with a dielectric layer, then etch a number of openings in the dielectric so that each opening exposes a contact area on one of the metal conductors, then deposit a metal plug in each opening so as to make electrical contact with the contact area. If the substrate is exposed to the ambient atmosphere or any other source of oxygen after the openings are formed, the surface of the semiconductor or metal layer exposed in each opening will become oxidized. This native oxide must be removed or "cleaned" before depositing the metal plug in order to achieve good electrical contact between the plug and the contact area. The process of removing native oxide from a metal conductor before depositing a metal plug is commonly termed "precleaning".

A serious shortcoming of conventional precleaning processes for metal conductors is that the precleaning process can damage the dielectric. Particularly susceptible to damage are "low-κ" dielectric materials that incorporate carbon atoms to reduce their dielectric constant "κ". We have measured an increase in the dielectric constant of such materials after performing a precleaning process.

SUMMARY OF THE INVENTION

The invention is a precleaning process suitable for fabricating metal plugs in a low-κ, carbon-containing dielectric. More specifically, the invention is a process for cleaning a contact area of a metal conductor on a semiconductor workpiece so as to minimize damage to a carbon-containing dielectric overlying the metal. After forming contact openings in the dielectric so as to expose contact areas on the underlying metal conductor, the contact areas are cleaned by exposing the workpiece to a plasma formed from a mixture of hydrogen-containing and helium gases.

Surprisingly, our hydrogen-helium plasma process can repair damage to the dielectric caused by preceding process steps. Accordingly, another aspect of our invention is a method of using such plasma process to repair damage to a carbon-containing dielectric on a semiconductor workpiece caused by an oxygen plasma process for stripping resist from the surface of the dielectric.

BRIEF DESCRIPTION OF THE DRAWINGS

FIG. 1 is a sectional view of a semiconductor workpiece on which the processes of the invention may be performed.

FIG. 2 is a flow chart of a photoresist ashing process and preclean process according to our invention.

FIG. 3 is a partially schematic, sectional view of a plasma chamber suitable for performing the preclean process of the invention.

DETAILED DESCRIPTION OF THE PREFERRED EMBODIMENTS

Our precleaning process is one segment of a sequence of process steps for forming a metal plug or via in a low-κ, carbon-containing dielectric on a semiconductor workpiece. A low-κ dielectric has a dielectric constant "κ" that is less than 3.8, preferably less than or equal to 3.0. An example of a low-κ, carbon-containing, silicon oxide dielectric and a process for forming it on a silicon wafer is described in commonly assigned U.S. patent application Ser. No. 09/247,381 filed Feb. 10, 1999 by Cheung et al., the entire content of which is hereby incorporated by reference into this patent specification. This type of carbon-containing silicon oxide has a dielectric constant less than that of conventional, non-carbon-containing silicon dioxide because it incorporates carbon atoms in the silicon oxide material. The carbon atoms typically are incorporated in the silicon oxide in the form of C—H bonds or C—F bonds. To achieve a low dielectric constant κ, the dielectric preferably has a carbon content of at least 1% by weight, more preferably at least 5 %.

FIG. 1 shows a conventional semiconductor workpiece or substrate 10 on which the processes of the invention may be performed. The substrate typically is a silicon wafer on which integrated circuits are to be formed or a glass substrate on which electronic video display devices and circuits are to be formed. The substrate is depicted as a silicon wafer in all of the following examples.

The workpiece or substrate 10 includes one or more regions 12 composed of a metal conductor such as copper or tungsten. The metal regions can be formed by any conventional metal deposition and patterning processes (FIG. 2, Step 101).

A low-κ, carbon-containing dielectric layer 14 overlies the metal regions. The dielectric 14 is patterned with a number of openings 16 so that each opening exposes an area 17 of one of the metal regions 12, this area 17 being termed the "contact area", "exposed area" or "exposed surface" of the metal region. (We define all portions of the metal regions 12 that are not covered by dielectric 14 as being "exposed" even though the exposed surface may be covered by thin layer of native oxide as a result of exposure of the metal to oxygen, such as oxygen in the ambient atmosphere.)

Each opening 16 subsequently will be filled with a metal material to form a "plug" or "via" that makes electrical contact with the underlying metal region 12.

The typical process for creating openings 16 in the dielectric is to deposit a blanket layer of dielectric 14 (Step 102), then employ a photo-lithographic process to form a pattern of photoresist 19 over all areas of the dielectric other than the areas where openings are desired (Step 103). A plasma etch process then etches openings 16 in all portions of the dielectric that are not covered by photoresist (Step 104).

If the workpiece is exposed to oxygen after the openings 16 are formed, the exposed surface of each contact area generally will oxidize to form a thin layer of "native oxide" 18. Such oxygen exposure may occur in an "ashing" process for removing photoresist 19 after etching the openings in the dielectric (Step 105), or it may occur if the workpiece is exposed to ambient atmosphere while it is transported between two process chambers. This native oxide must be removed or "cleaned" before depositing the metal plug in order to achieve good electrical contact between the plug and the contact area. The process of removing such native oxide (Step 106) is termed "precleaning" because it precedes deposition of the metal plug.

In our invention, the precleaning of the contact area 17 (Step 106) is performed by exposing the workpiece 10 to an atmosphere formed by plasma decomposition of a gas mixture that includes helium and at least one species of a hydrogen-containing gas. Although our invention is not limited to a specific theory of operation, we believe that the plasma dissociates the hydrogen-containing gas to produce hydrogen radicals and ions that migrate from the plasma to the semiconductor workpiece. Upon contact with the native oxide 18 on the workpiece, the hydrogen radicals and ions react with the oxygen component of the native oxide to form volatile hydroxyls and water vapor that are exhausted from the chamber by the exhaust pump, thereby removing the native oxide 18 from the surface of the metal contact areas 12.

To minimize damage to the low-κ, carbon-containing dielectric, it is preferable to form the plasma by a method that minimizes electric fields at the workpiece position.

One suitable method of forming the plasma is in a conventional remote plasma source, which means that the plasma either is formed in a separate chamber from the vacuum chamber that holds the workpiece, or else the plasma is formed in a separate region of a common chamber such that the plasma body is a substantial distance from the workpiece. In either case, an exhaust pump causes radicals and ions produced by decomposition of gases in the plasma to flow from the plasma body to the workpiece. Conventional process chambers having remote plasma sources are described in commonly-assigned U.S. Pat. No. 5,346,579 to Cook et al. and U.S. Pat. No. 5,543,688 to Morita, the entire content of each of which is hereby incorporated by reference into this patent specification.

Alternatively, our currently preferred method of forming the plasma so as to avoid sputtering damage to the workpiece is in a plasma chamber having an inductively coupled plasma source, such as the commercially available preclean chamber 20 shown in FIG. 3.

The upper portion of the chamber is bounded by an upper wall 22 composed of dielectric material, typically quartz, and the lower portion of the chamber is bounded by a lower wall 23 composed of either dielectric or conducting material, typically aluminum. The hydrogen-helium gas mixture described above flows from a gas supply tank 24 at a flow rate regulated by a flow controller 26, typically a mass flow controller, and then is injected into the upper portion of the chamber through one or more gas inlet ports 28. An exhaust pump, not shown, exhausts chamber gases through exhaust port 30 and regulates the chamber pressure.

A primary RF power supply 32 supplies RF electrical power to an induction coil 34 that encircles the dielectric upper chamber wall 22. The electrical power is inductively coupled from the coil to the gases in the upper portion of the chamber so as to excite the gases to a plasma state.

The workpiece or substrate 10 is mounted in the lower portion of the chamber on a pedestal or susceptor 36, typically composed of aluminum or titanium. All surfaces of the susceptor that are not covered by the substrate are covered by a dielectric 37, typically quartz.

A second RF power supply 38, also called a bias RF power supply, supplies RF power to the pedestal. The bias RF power supply can help ignite and sustain the plasma, and it can produce a DC bias voltage on the pedestal that in most cases is negative relative to the plasma body. The negative bias voltage accelerates ions from the plasma toward the susceptor.

Since RF bias power increases the risk of damage to the dielectric by ion bombardment, we prefer using the lowest possible RF bias power. We believe we can successfully remove native oxide from the metal 12 without any RF bias power applied to the pedestal. However, in the illustrated inductively-coupled plasma chamber, some RF bias power usually is required to initiate or "strike" the plasma. In addition, a small amount of RF bias power can ensure that changing process conditions do not extinguish the plasma. Therefore, in our preferred implementation we program the controller 44 to command the bias RF power supply 38 to initially apply to the pedestal 40 watts of RF power at a frequency of 13.56 MHz in order to initiate or strike the plasma, and to then reduce the bias RF power to 10 watts throughout the precleaning process. At low power levels such as the preferred 10 watts, we find the DC bias voltage on the pedestal is close to zero, and even can be positive in the preferred chamber of FIG. 3.

In a chamber having a remote plasma source, we do not believe there would be any need to apply RF bias power to the pedestal.

Our preferred hydrogen-containing gas is $H_2$. Alternative choices include $NH_3$ (ammonia) and $SiH_4$ (silane).

A preferred gas mixture is 5% $H_2$ and 95% He by molecular molar concentration, which is approximately the same concentration by gas volume. Since $H_2$ and He are diatomic and monatomic gases, respectively, this is equivalent to 10% H and 90% He by atomic molar concentration.

Our precleaning process is especially useful for cleaning metal regions 12 composed of copper, because copper oxide is readily reduced by hydrogen at temperatures below 100° C. Most other metals would require greater heating of the substrate in order to perform the reduction reaction. The feasibility of subjecting the substrate to the required temperature depends on whether the dielectric 14 and other structures on the substrate would be damaged.

The helium carrier gas advantageously enhances the dissociation of the hydrogen in the plasma. Because helium ions are very light, they will subject the dielectric 14 to little or no sputtering damage. In contrast, carrier gases composed of atomic species having a greater atomic mass, such as argon, would be more likely to damage the dielectric, as evidenced by the comparative test results described below. Therefore, to minimize sputtering of the dielectric, we recommend that the gas mixture does not include $BCl_3$, argon, or any compound of any element having an atomic mass greater than the atomic mass of argon.

The hydrogen-containing plasma is maintained as long as necessary to remove the native oxide 18. In tests processing 200 mm diameter silicon wafers in the illustrated inductively coupled plasma chamber, with 300 watts RF power applied to the induction coil, we found that 30 seconds was more than adequate to remove the thickest copper oxide film 18 we encountered. We found that either increasing the plasma cleaning time to 60 seconds, or increasing the RF power to 450 watts, slightly increased the damage to the dielectric, as evidenced by an increase in its dielectric constant. The test results are described below.

Other process parameters in our preferred embodiment for precleaning a 200 mm silicon wafer include a 100 sccm flow rate for the $H_2$—He gas mixture and a chamber pressure of 80 millitorr.

All process steps preferably are controlled by a programmable controller such as microcomputer 44 which controls the amount of power supplied by the RF power supplies 32, 38 and controls the flow rate of the hydrogen-helium gas mixture provided by the flow controller 26.

Comparative Tests

We tested the effect of our metal precleaning process on the dielectric constant of a carbon-containing low-κ dielectric film. To simplify the test, we did not actually clean a metal film. Instead, we subjected a blanket layer of low-κ dielectric to the same hydrogen-helium plasma process that we would use to clean a copper film. This test indicates whether our metal precleaning process would damage the low-κ dielectric, as evidenced by our measurement of the increase in the dielectric constant κ after performing our preclean process. We compared our preclean process with an argon sputtering preclean process. We also tested the performance of our process as a function of RF power, hydrogen concentration; and duration.

In our tests, the low-κ dielectric film was deposited on 200 mm diameter silicon wafers in with the dielectric deposition process described in the above-referenced patent application Ser. No. 09/247,381. This process deposits a dielectric having a dielectric constant κ of about 2.70 to 2.75. The test data shown in Tables 1 and 2 shows the amount by which the tested preclean processes increased the dielectric constant above this value. The increase in dielectric constant indicates the degree of damage to the dielectric film.

Our preclean process was performed in the previously described preclean chamber shown in FIG. 3. In all cases the chamber pressure was 80 mTorr, the flow rate of the hydrogen-helium gas mixture was 100 sccm, the RF power applied to the induction coil was at a frequency of 2 MHz and the power level shown in Tables 1 and 2. Also, in all cases the preclean process was preceded by a de-gas step in which the wafer was maintained at 400° C. for one minute to drive out moisture and at the dielectric may have been absorbed during prior exposure to atmosphere.

We also tested whether thermal annealing would repair damage to the dielectric film 14. After performing the preclean process, we annealed the dielectric film by heating the substrate to 400° C. for 30 minutes in a vacuum environment (Step 107). Tables 1 and 2 show our measurement of the in dielectric constant before and after the annealing step.

ing further exacerbated the increase in dielectric constant caused by argon sputtering. In contrast, Run 2 shows that the anneal step repaired the minor damage inflicted by our $H_2$—He preclean process by reducing the dielectric constant to a value only 0.05 greater than that before the precleaning. Runs 3–8 also show that the annealing step reduced the dielectric constant, which indicates that the annealing repaired some of the damage to the dielectric film caused by our $H_2$—He plasma precleaning process.

Therefore, after performing our $H_2$—He plasma precleaning process (Step 106), it is highly beneficial to anneal the substrate at a sufficient temperature and duration to reduce the dielectric constant of the dielectric film (Step 107). The anneal temperature should be greater than 100° C., preferably at least 300° C., and most preferably in the range of 300° C. to 450° C. If the annealing is performed in a conventional thermal anneal chamber—i.e., a chamber that heats the workpiece primarily by thermal conduction and convection rather than radiation—the workpiece typically should be annealed for at least five minutes, and more preferably 30 minutes. Alternatively, a radiant heating chamber, commonly called a rapid thermal processing chamber, can radiantly heat the surface of the workpiece to a much higher temperature for a much shorter duration.

Runs 3–8 show that increasing the hydrogen concentration, the RF power to the induction coil, or the duration of the preclean process increases the damage to the dielectric. Therefore, the process parameters of Run 2 are preferred.

We also tested the effects of preceding the preclean process with a conventional oxygen plasma ashing process. As described earlier, plasma ashing is conventionally performed prior to metal precleaning in order to remove various organic material from the surface of the dielectric. Such organic material may include photoresist on the top surface of the dielectric, a "passivation layer" deposited on the side walls of the via openings during the etching of the vias, and other organic byproducts of the etch process. In oxygen plasma ashing, the organic material is removed or "stripped" by exposing the workpiece to an atmosphere formed by plasma decomposition of oxygen, and optionally other

TABLE 1

Effect of Preclean on Dielectric Constant: Without Plasma Ashing

| Run | Gas | RF Power to Induction Coil | Duration | Increase in Dielectric Constant: Before Anneal | Increase in Dielectric Constant: After Anneal |
|---|---|---|---|---|---|
| 1 | Ar (Sputter) | 300 W (& 300 W bias) | 30 sec. | 0.16 | 0.21 |
| 2 | 5% $H_2$/95% He | 300 W | 30 sec. | 0.10 | 0.05 |
| 3 | 5% $H_2$/95% He | 300 W | 60 sec. | 0.17 | 0.12 |
| 4 | 5% $H_2$/95% He | 300 W | 120 sec. | 0.23 | 0.19 |
| 5 | 5% $H_2$/95% He | 450 W | 60 sec. | 0.19 | 0.14 |
| 6 | 10% $H_2$/90% He | 300 W | 30 sec. | 0.22 | 0.19 |
| 7 | 10% $H_2$/90% He | 300 W | 60 sec. | 0.26 | 0.20 |
| 8 | 10% $H_2$/90% He | 450 W | 60 sec. | 0.30 | 0.20 |

Referring to Table 1, Run 1 shows that a conventional argon sputter cleaning process increased electric constant by 0.16. In contrast, Run 2 shows that our $H_2$—He reactive cleaning process inflicted less damage to the dielectric, as it increased the dielectric constant by only 0.10.

Table 1 also shows that a subsequent anneal step is surprisingly synergistic with our $H_2$—He process, in contrast with the detrimental effect of annealing after a conventional argon sputtering process. Referring to Run 1, anneal-gases. Preferred parameters of a conventional oxygen plasma ashing process for stripping photoresist after patterning of a silicon oxide dielectric are 500 to 1000 sccm oxygen gas flow rate, with no carrier gas, 15 mT chamber pressure, and 3000 watts of RF power at 2 MHz applied to the induction coil of an inductively-coupled plasma chamber like that shown in FIG. 3. No bias RF power is used during the ashing process so as to avoid sputtering damage to the dielectric.

TABLE 2

Effect of Preclean on Dielectric Constant: Preceded by Plasma Ashing

| Run | Gas | RF Power to Induction Coil | Duration | Increase in Dielectric Constant: Before Anneal | Increase in Dielectric Constant: After Anneal |
|---|---|---|---|---|---|
| 0 | None (ashing only) | 0 | 0 | 0.25 | 0.32 |
| 1 | Ar (Sputter) | 300 W (+300 W bias) | 30 sec. | 0.18 | 0.23 |
| 2 | 5% $H_2$/95% He | 300 W | 30 sec. | 0.14 | 0.16 |
| 3 | 5% $H_2$/95% He | 300 W | 60 sec. | 0.16 | 0.19 |
| 4 | 5% $H_2$/95% He | 300 W | 120 sec. | 0.16 | 0.18 |
| 5 | 5% $H_2$/95% He | 450 W | 60 sec. | 0.17 | 0.21 |
| 6 | 10% $H_2$/90% He | 300 W | 30 sec. | | 0.28 |
| 7 | 10% $H_2$/90% He | 300 W | 60 sec. | | 0.28 |
| 8 | 10% $H_2$/90% He | 450 W | 60 sec. | | 0.28 |

Table 2 shows the test results when wafers were subjected to the just described oxygen plasma ashing process prior to the previously described de-gas and preclean processes. Except for the ashing process, the test conditions were identical to those of the tests reported in Table 1.

Run 0 represents the substrate following the oxygen plasma ashing process, prior to the de-gas process and the precleaning process. The increase in dielectric constant shown in Table 2, Run 0 is greater than the increase shown in Table 1, Run 1. This result indicates that the oxygen plasma ashing process damaged the dielectric even more than the argon sputtering process reported in Table 1, Run 1.

In Table 2 the dielectric constants for Runs 1–8 are lower than the dielectric constants in the corresponding column for Run 0. This result indicates that both the argon sputter precleaning (Run 1) and the hydrogen-helium reactive plasma cleaning of our invention (Runs 2–8) repair some of the damage to the dielectric caused by the ashing (Run 0). It is surprising that these precleaning processes, which by themselves cause damage to the dielectric as shown in Table 1, produce the opposite effect—repairing damage to the dielectric—when performed after plasma ashing.

The best results were achieved with Run 2, the embodiment of our hydrogen-helium reactive cleaning process having the lowest tested values for hydrogen concentration, RF power, and process duration. This is the same set of process conditions that minimized the damage to the dielectric in the tests without ashing reported in Table 1.

In contrast to the tests without ashing reported in Table 1, Table 2 shows that when oxygen plasma ashing is performed before precleaning, thermal annealing does not help repair the damage to the dielectric. In every test reported in Table 2, thermal annealing worsened the damage to the dielectric, as evidenced by an increase in the measured dielectric constant after annealing. Therefore, after precleaning wafers that have been subjected to oxygen plasma ashing, it is preferable to omit thermal annealing.

The results (Runs 6–8) using 10% hydrogen by molecular molar concentration (20% by atomic molar concentration) are significantly worse than those for 5% hydrogen (Runs 2–5). We believe the higher hydrogen concentration resulted in positively charged hydrogen ions being implanted into the plasma ashed films, thereby shifting the flat-band voltage. This shift in flat-band voltage did not appear to occur in the tests performed with 5% $H_2$/95% He (Runs 2–5). Therefore, a $H_2$—He gas mixture having a hydrogen content of 5% or less by molecular molar concentration (10% or less by atomic molar concentration) is preferred when performing the preclean process on a dielectric film that has been subjected to oxygen plasma ashing.

In summary, the test results for processes that do not employ plasma ashing show that our preferred $H_2$—He reactive cleaning process (Table 1, Run 2) produces essentially no damage to the low-κ, carbon-containing dielectric. For process that do employ oxygen plasma ashing, our preferred $H_2$—He reactive cleaning process (Table 2, Run 2) surprisingly repairs much of the damage to the dielectric caused by the ashing process.

What is claimed is:

1. A method of removing native oxide from an area of a metal conductor exposed in at least one opening in a carbon-containing dielectric on a semiconductor workpiece, comprising the steps of:
   providing a semiconductor workpiece having a metal conductor exposed in at least one opening in a carbon-containing dielectric, wherein a surface of the metal conductor includes a native oxide of the metal conductor; and
   exposing the workpiece to an atmosphere produced by plasma decomposition of a gas mixture, wherein the gas mixture includes helium and at least one hydrogen-containing gas species, and wherein the exposing step is performed for a time long enough to remove the native oxide from said surface of the metal conductor.

2. A method according to claim 1, wherein the dielectric has a dielectric constant less than 3.8.

3. A method according to claim 1, wherein the dielectric has a dielectric constant less than or equal to 3.0.

4. A method according to claim 1, wherein the dielectric is an oxide of silicon having a chemical structure that incorporates carbon.

5. A method according to claim 1, wherein the dielectric contains at least five percent carbon by weight.

6. A method according to claim 1, further comprising the step of:
   subsequent to the exposing step, annealing the workpiece at a temperature and a duration sufficient to reduce the dielectric constant of the dielectric relative to the value of said dielectric constant after the exposing step and prior to the annealing step.

7. A method according to claim 1, wherein the gas mixture has an atomic molar concentration of hydrogen no greater than twenty percent.

8. A method according to claim 1, wherein the gas mixture has a atomic molar concentration of hydrogen no greater than ten percent.

9. A method according to claim 1, wherein the hydrogen-containing species is $H_2$ gas.

10. A method according to claim 9, wherein the gas mixture has a molecular molar concentration of $H_2$ gas no greater than ten percent.

11. A method according to claim 9, wherein the gas mixture has a molecular molar concentration of $H_2$ gas no greater than five percent.

12. A method according to claim 1, wherein the gas mixture does not include argon.

13. A method according to claim 1, wherein the gas mixture does not include $BCl_3$, argon, or any compound of any element having an atomic mass greater than the atomic mass of argon.

14. A method of removing native oxide from an exposed surface of a metal conductor on a semiconductor workpiece, comprising the steps of:

providing a semiconductor workpiece that includes a metal conductor having an exposed surface that includes a native oxide of the metal conductor; and exposing the workpiece to an atmosphere-produced by plasma decomposition of a gas mixture, wherein the gas mixture includes helium and at least one hydrogen-containing gas species, and wherein the exposing step is performed for a time long enough to remove the native oxide from said exposed area of the metal conductor.

15. A method according to claim 14, wherein the metal conductor is copper.

16. A method according to claim 14, wherein the gas mixture has an atomic molar concentration of hydrogen no greater than twenty percent.

17. A method according to claim 14, wherein the gas mixture has a atomic molar concentration of hydrogen no greater than ten percent.

18. A method according to claim 14, wherein the hydrogen-containing species is $H_2$ gas.

19. A method according to claim 18, wherein the gas mixture has a molecular molar concentration of $H_2$ gas no greater than ten percent.

20. A method according to claim 18, wherein the gas mixture has a molecular molar concentration of $H_2$ gas no greater than five percent.

21. A method according to claim 14, wherein the exposing step further comprises the steps of:

positioning the workpiece within a vacuum chamber;

supplying the gas mixture into the vacuum chamber; and inductively coupling RF power to the gas mixture within the vacuum chamber so as to form a plasma.

22. A method according to claim 14, wherein the exposing step further comprises the steps of:

positioning the workpiece within a vacuum chamber;

supplying the gas mixture to a remote plasma chamber;

coupling electromagnetic power to the gas mixture to form a plasma that includes reactive species produced by plasma decomposition of the gas mixture; and supplying said reactive species from the remote plasma chamber to the vacuum chamber.

23. A method of removing organic material from a semiconductor workpiece having a metal conductor exposed in at least one opening in a carbon-containing dielectric, comprising the steps of:

providing a semiconductor workpiece having a metal conductor exposed in at least one opening in a carbon-containing dielectric and having an organic material exposed on a surface of the workpiece;

exposing the workpiece to an oxygen plasma so as to remove said organic material from the surface of the workpiece; and subsequently exposing the workpiece to an atmosphere produced by plasma decomposition of a gas mixture, wherein the gas mixture includes helium and at least one hydrogen-containing gas species.

24. A method according to claim 23, wherein:

the step of exposing the workpiece to an oxygen plasma produces a native oxide on said exposed metal conductor; and the step of exposing the workpiece to said atmosphere is performed for a time long enough to remove said native oxide.

25. A method according to claim 23, wherein:

the carbon-containing dielectric is characterized by a dielectric constant; and the step of exposing the workpiece to said atmosphere is performed for a time long enough to decrease the dielectric constant of the carbon-containing dielectric.

26. A method according to claim 23, wherein the organic material comprises photoresist.

27. A method according to claim 23, wherein the step of providing the workpiece comprises the step of:

etching an opening in the carbon-containing dielectric and simultaneously depositing an organic residue on a surface of the opening;

wherein said organic material comprises the organic residue deposited in the etching step.

28. A method of cleaning an area of a metal conductor exposed in at least one opening in a carbon-containing dielectric on a semiconductor workpiece, comprising the steps of:

providing a semiconductor workpiece having a metal conductor exposed in at least one opening in a carbon-containing dielectric; and exposing the workpiece to an atmosphere produced by plasma decomposition of a gas mixture, wherein the gas mixture includes helium and at least one hydrogen-containing gas species, and wherein the gas mixture does not include argon.

29. A method according to claim 28, wherein the gas mixture does not include $BCl_3$ or any compound of any element having an atomic mass greater than the atomic mass of argon.

30. A method of cleaning an area of a metal conductor exposed in at least one opening in a dielectric on a semiconductor workpiece, comprising the steps of:

providing a semiconductor workpiece having a metal conductor exposed in at least one opening in a dielectric;

exposing the workpiece to an atmosphere produced by plasma decomposition of a gas mixture, wherein the gas mixture includes helium and at least one hydrogen-containing gas species; and subsequently thermally annealing the workpiece at a temperature and a duration sufficient to reduce the dielectric constant of the dielectric relative to the value of said dielectric constant after the exposing step and prior to the annealing step, wherein said temperature is greater than 100° C.

31. A method according to claim 30, wherein the dielectric contains carbon.

32. A method according to claim 30, wherein the annealing step comprises maintaining the workpiece in a vacuum.

33. A method according to claim 30, wherein the annealing step comprises maintaining the workpiece at a temperature of at least 300° C.

* * * * *